United States Patent
Hsu et al.

(10) Patent No.: US 10,373,992 B1
(45) Date of Patent: Aug. 6, 2019

(54) COMPACT CAMERA MODULE

(71) Applicant: Apple Inc., Cupertino, CA (US)

(72) Inventors: Ya Wen Hsu, San Francisco, CA (US);
Douglas S. Brodie, Los Gatos, CA (US); Steven Webster, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 163 days.

(21) Appl. No.: 15/672,249

(22) Filed: Aug. 8, 2017

Related U.S. Application Data

(60) Provisional application No. 62/372,717, filed on Aug. 9, 2016.

(51) Int. Cl.
| | |
|---|---|
| *H01L 27/00* | (2006.01) |
| *H04N 5/00* | (2011.01) |
| *H01L 27/146* | (2006.01) |
| *H04N 5/225* | (2006.01) |
| *G02B 7/02* | (2006.01) |
| *H01L 31/0232* | (2014.01) |

(52) U.S. Cl.
CPC ......... *H01L 27/14618* (2013.01); *G02B 7/02* (2013.01); *H01L 27/14625* (2013.01); *H01L 27/14685* (2013.01); *H01L 31/02327* (2013.01); *H04N 5/2253* (2013.01)

(58) Field of Classification Search
CPC ......... H01L 27/14618; H01L 27/14625; H01L 31/02327; H01L 27/14685; G02B 7/02; H04N 5/2253

USPC ....................................................... 250/208.1
See application file for complete search history.

(56) References Cited

U.S. PATENT DOCUMENTS

| | | | |
|---|---|---|---|
| 7,057,833 B2 * | 6/2006 | Ooi .......................... | G02B 7/02 235/454 |
| 7,484,901 B2 | 2/2009 | Seo et al. | |
| 9,106,819 B1 | 8/2015 | Gao et al. | |
| 9,313,382 B2 | 4/2016 | Igarashi | |
| 2003/0034394 A1 * | 2/2003 | Gannon ............. | G06K 7/10732 235/454 |

* cited by examiner

*Primary Examiner* — Seung C Sohn
(74) *Attorney, Agent, or Firm* — Robert C. Kowert; Meyertons, Hood, Kivlin, Kowert & Goetzel, P.C.

(57) ABSTRACT

Compact camera modules that may be used in small form factor devices. The camera module may include a lens holder configured to receive one or more lens elements and a photosensor. In some embodiments, the lens holder may define a first recess for receiving the lens elements and a second recess for receiving one or more other components, such as the photosensor. In some embodiments, the photosensor may be configured to communicate with a flex circuit board without coupling the photosensor to a substrate to form a flip chip that communicates with the flex circuit board. The photosensor may be optically aligned with the lens elements and bonded to the lens holder such that the photosensor is fixed in an aligned position and at least partially enclosed by the lens holder.

20 Claims, 8 Drawing Sheets

COMPACT CAMERA MODULE

This application claims benefit of priority to U.S. Provisional Application No. 62/372,717, filed Aug. 9, 2016, titled "Compact Camera Module", which is hereby incorporated by reference in its entirety.

BACKGROUND

Technical Field

This disclosure relates generally to camera modules, and more specifically to small form factor, or compact, camera modules.

Description of the Related Art

The advent of small, mobile multipurpose devices such as smartphones and tablet or pad devices has resulted in a need for high-resolution, small form factor cameras for integration in the devices. Some camera modules, however, are designed such that certain limitations are encountered with respect to reducing form factor. For instance, some camera modules may include a stack of components that are coupled to a lens holder that contains lens elements. In other words, the stack of components may significantly add to the z dimension of such camera modules. Furthermore, some camera modules may include an image sensor that is designed to be coupled to a substrate to form a flip chip that allows the image sensor to communicate with another component (e.g., a flex circuit board). The image sensor-substrate combination is but one example of the limitations that may be encountered with respect to form factor of some camera modules.

SUMMARY OF EMBODIMENTS

Embodiments of the present disclosure may provide camera modules in small package sizes, referred to as small format factor, or compact, camera modules. In some embodiments, a camera module may include a lens holder and a photosensor. The lens holder may be configured to hold one or more lens elements of a camera. In some examples, the lens holder may include a first portion (e.g., a barrel portion) that defines a first recess. The first recess may extend from the first surface of the lens holder to a second surface of the lens holder. In some embodiments, the first portion of the lens holder may be configured to hold the one or more lens elements within the first recess. Furthermore, the first portion may define an aperture. The aperture may be configured to allow light to pass through the lens holder and to the one or more lens elements.

In some embodiments, the photosensor may be disposed at least partially within the lens holder. Furthermore, the photosensor may be fixed to the lens holder. In some examples, the lens holder may include a second portion (e.g., a base portion) that defines a second recess. The second recess may extend from the second surface of the lens holder to a third surface of the lens holder. In some examples, the photosensor may be disposed proximate the second surface and between the second surface and the third surface. Additionally or alternatively, the photosensor may be disposed within the second recess and bonded to the second portion proximate the second surface. In some embodiments, the first surface defines a first plane, the second surface defines a second plane that is parallel to the first plane, and the third surface defines a third plane that is parallel to the first plane and to the second plane. Furthermore, the one or more lens elements may define an optical axis that intersects the first plane, the second plane, and the third plane.

In some embodiments, the photosensor may include a first side for capturing light projected onto the first side. Furthermore, the photosensor may include a second side that is opposite the first side. The photosensor may be configured to transmit image signals from the first side to the second side. For example, the photosensor may include at least one vertical interconnect access (VIA) within the photosensor for transmitting the image signals from the first side of the photosensor to the second side of the photosensor.

In some embodiments, an adhesive may be disposed between at least a portion of the photosensor and at least a portion of the lens holder. For instance, the adhesive may be disposed between the first side of the photosensor and the second surface of the lens holder. The adhesive may bond the photosensor to the lens holder.

In various embodiments, the camera module may further include a flex circuit board. The flex circuit board may be bonded to the photosensor. The flex circuit board may be configured to receive image signals from the photosensor. For instance, the flex circuit board may be configured to receive the image signals from the second side of the photosensor. In some examples, the second side of the photosensor may include one or more contact elements configured to contact the flex circuit board and transmit the image signals from the second side of the photosensor to the flex circuit board. Furthermore, flex circuit board may include one or more contact elements, and the flex circuit board may be bonded to the photosensor such that at least one contact element of the flex circuit board is in contact with and/or in electrical communication with at least contact element of the photosensor.

According to various embodiments, the camera module may include a flex circuit board. The flex circuit board may be coupled to at least one of the photosensor or the lens holder. The flex circuit board may be configured to receive data/information from the photosensor and transmit the data/information to one or more other components. In some examples, the flex circuit board may be at least partially disposed within the second recess. The flex circuit board may be disposed proximate the photosensor. For example, the photosensor may include a first side and a second side. The first side of the photosensor may be proximate the one or more lens elements. The second side of the photosensor may, in some cases, be located opposite the first side of the photosensor. The flex circuit board may be disposed proximate the second side of the photosensor. In some embodiments, at least a portion of the flex circuit board may be in contact and/or electrical communication with the photosensor. For instance, the second side of the photosensor may include one or more contact elements configured to contact the flex circuit board and transmit data from the photosensor to the flex circuit board.

In some embodiments, the camera module may include a substrate. For instance, the substrate may be a stiffener that is coupled to the lens holder and/or the flex circuit board. The substrate may function to structurally support and/or protect the flex circuit board.

Furthermore, in some embodiments, the camera module may include a filter (e.g., an optical filter). In some examples, the filter may be disposed between the one or more lens elements and the photosensor. In other examples, the optical filter may be a coating that is applied to at least one of the lens elements.

Some embodiments of the present disclosure may provide a method of manufacturing a camera module. The method may include receiving a lens holder. The lens holder may define a first recess and a second recess. The lens holder may hold one or more lens elements within the first recess. The method may further include applying an adhesive to a photosensor and/or the lens holder. The photosensor may be placed within the second recess of the lens holder such that the adhesive is in contact with at least a portion of the photosensor and at least a portion of the lens holder.

In some embodiments, the method may include performing active alignment to orient the photosensor to an aligned position relative to the one or more lens elements. The photosensor may be optically aligned with the one or more lens elements when the photosensor is in the aligned position. In some cases, performing the active alignment may include monitoring at least one optical parameter that is based at least in part upon the photosensor receiving light that has passed through the one or more lens elements. Furthermore, performing the active alignment may include iteratively adjusting positioning of the photosensor relative to the one or more lens elements until at least one optical parameter satisfies at least one optical threshold.

Furthermore, the method may include curing the adhesive to bond the photosensor to the lens holder and to fix the photosensor in the aligned position.

In some embodiments, the method may further include bonding a flex circuit board to the photosensor. For example, the flex circuit board may be bonded to the photosensor such that at least one contact element of the flex circuit board is in contact with at least one contact element of the photosensor.

BRIEF DESCRIPTION OF THE DRAWINGS

FIG. 1 includes a top view of the example camera module to provide context for the cross-sectional illustration.

Figure 1:
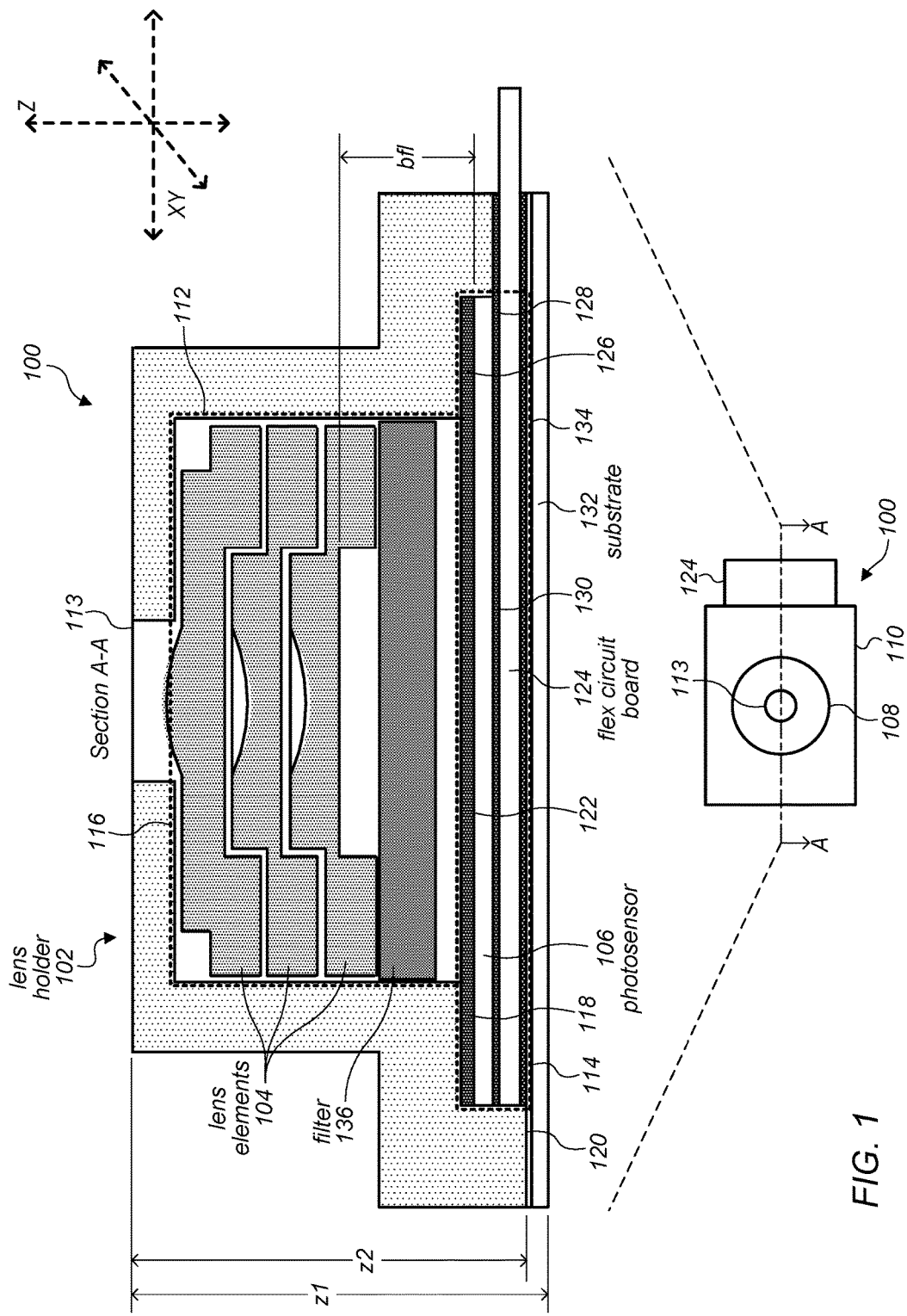
FIG. 1 is a cross-sectional illustration of an example camera module, in accordance with some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ". Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Embodiments of the present disclosure may provide camera modules in small package sizes, referred to as small format factor, or compact, camera modules. Embodiments of the camera modules may be used in cameras with a small package size, referred to as small form factor cameras. As will be discussed in further detail below, the camera modules disclosed herein may be designed to have fewer components and/or a smaller form factor than other camera modules. Moreover, the camera modules described herein may be designed to have a simpler assembly process and/or a simpler manufacturing process than other camera modules. As non-limiting examples, some processes for assembling and/or manufacturing the camera modules disclosed herein may include fewer steps, fewer components to assemble, fewer components to manufacture, less expensive assembly costs, and/or less expensive manufacturing costs, as compared to other camera modules.

In some embodiments, an example camera module may include a lens holder, one or more lens elements, and a photosensor (e.g., an image sensor). The lens holder may be configured to hold the lens elements and the photosensor. In some examples, the lens holder may include a first portion (e.g., a barrel portion) that defines a first recess. The first recess may extend from the first surface of the lens holder to a second surface of the lens holder. In some embodiments, the first portion of the lens holder may be configured to hold the one or more lens elements within the first recess. Furthermore, the first portion may define an aperture. The aperture may be configured to allow light to pass through the lens holder and to the one or more lens elements.

In some embodiments, the photosensor may be disposed at least partially within the lens holder. Furthermore, the photosensor may be fixed to the lens holder. In some examples, the lens holder may include a second portion (e.g., a base portion) that defines a second recess. The second recess may extend from the second surface of the lens holder to a third surface of the lens holder. In some examples, the photosensor may be disposed proximate the second surface and between the second surface and the third surface. Additionally or alternatively, the photosensor may be disposed within the second recess and bonded to the second portion proximate the second surface. In some embodiments, the first surface defines a first plane, the second surface defines a second plane that is parallel to the first plane, and the third surface defines a third plane that is parallel to the first plane and to the second plane. Furthermore, the one or more lens elements may define an optical axis that intersects the first plane, the second plane, and the third plane.

In some embodiments, the photosensor may include a first side for capturing light projected onto the first side. Furthermore, the photosensor may include a second side that is opposite the first side. The photosensor may be configured to transmit image signals from the first side to the second side. For example, the photosensor may include at least one vertical interconnect access (VIA) within the photosensor for transmitting the image signals from the first side of the photosensor to the second side of the photosensor.

In some embodiments, an adhesive may be disposed between at least a portion of the photosensor and at least a portion of the lens holder. For instance, the adhesive may be disposed between the first side of the photosensor and the second surface of the lens holder. The adhesive may bond the photosensor to the lens holder.

In various embodiments, the camera module may further include a flex circuit board. The flex circuit board may be bonded to the photosensor. The flex circuit board may be configured to receive image signals from the photosensor. For instance, the flex circuit board may be configured to receive the image signals from the second side of the photosensor. In some examples, the second side of the photosensor may include one or more contact elements configured to contact the flex circuit board and transmit the image signals from the second side of the photosensor to the flex circuit board. Furthermore, flex circuit board may include one or more contact elements, and the flex circuit board may be bonded to the photosensor such that at least one contact element of the flex circuit board is in contact with and/or in electrical communication with at least contact element of the photosensor.

According to various embodiments, the camera module may include a flex circuit board. The flex circuit board may be coupled to at least one of the photosensor or the lens holder. The flex circuit board may be configured to receive data/information from the photosensor and transmit the data/information to one or more other components. In some examples, the flex circuit board may be at least partially disposed within the second recess. The flex circuit board may be disposed proximate the photosensor. For example, the photosensor may include a first side and a second side. The first side of the photosensor may be proximate the one or more lens elements. The second side of the photosensor may, in some cases, be located opposite the first side of the photosensor. The flex circuit board may be disposed proximate the second side of the photosensor. In some embodiments, at least a portion of the flex circuit board may be in contact and/or electrical communication with the photosensor. For instance, the second side of the photosensor may include one or more contact elements configured to contact the flex circuit board and transmit data from the photosensor to the flex circuit board.

In some embodiments, the camera module may include a substrate. For instance, the substrate may be a stiffener that is coupled to the lens holder and/or the flex circuit board. The substrate may function to structurally support and/or protect the flex circuit board.

Furthermore, in some embodiments, the camera module may include a filter (e.g., an optical filter). In some examples, the filter may be disposed between the one or more lens elements and the photosensor. In other examples, the optical filter may be a coating that is applied to at least one of the lens elements.

FIG. 1 is a cross-sectional illustration of an example camera module 100, according to some embodiments. The camera module 100 may include a lens holder 102, one or more lens elements 104, and a photosensor 106 (e.g., an image sensor). The lens holder 102 may be configured to receive the lens elements 104 and the photosensor 106. For instance, the lens holder 102 may include a first portion 108 (e.g., a barrel portion) and a second portion 110 (e.g., a base portion). The first portion 108 of the lens holder 102 may define a first recess 112 configured to receive the lens elements 104. In some embodiments, the first portion 108 may define an aperture 113. The aperture 113 may be configured to allow light rays to pass through the lens holder and to the lens elements 104. Furthermore, the first portion 108 of the lens holder 102 and/or the second portion 110 of the lens holder 102 may define a second recess 114 configured to receive the photosensor 106. Although FIG. 1 depicts three lens elements 104, it should be understood that the camera module 100 may include fewer or more lens elements.

One or more of the lens elements 104 may be of different shapes, geometries, sizes, or materials (e.g., plastics, glass, etc.) with different optical properties (e.g., refractive index, Abbe number, etc.). Spacing between the lens elements 104 may be different than shown, and various power orders for the lens elements 104 may be used. For example, in an example where the camera module 100 includes five lens elements, the power order, from the first lens element to the fifth lens element, may be PNNP, PNPNP, or some other order, where P indicates a lens with positive refractive power, and N represents a lens with negative refractive power. In some embodiments, parameters of the lens elements 104 including but not limited to lens shape, size, geometry, position, and materials may be selected at least in part to reduce, compensate, or correct for lens artifacts and effects including one or more of, but not limited to, vignetting, chromatic aberration, the field curvature or Petzval sum, and lens flare. For example, the lens elements 104 may be selected and arranged such that mechanical vignetting is reduced or eliminated.

In some embodiments, the first recess 112 may extend, in the z dimension, from a first surface 116 of the lens holder 102 to a second surface 118 of the lens holder 102. The first surface 116 may, in some cases, define a first plane (not shown) that extends along the x-y dimensions. Likewise, the second surface 118 may define a second plane (not shown) that extends along the x-y dimensions. The lens elements 104 may be disposed between the first surface 116 and the second surface 118, e.g., between the first plane and the second plane.

In some embodiments, the lens elements 104 may be coupled to the lens holder 102 and/or to one another. For instance, at least a portion of a lens element 104 may be bonded to at least a portion of the lens holder 102 and/or to at least a portion of another lens element 104 using an adhesive. In some examples, the lens elements 104 may be coupled to the lens holder 102 and/or to one another by mechanical means. For instance, the lens elements 104 may be configured to press fit to the lens holder 102 and/or to one another.

According to some embodiments, the second recess 114 may extend, in the z dimension, from the second surface 118 to a fourth surface. The second surface 118 may, in some cases, define a second plane (not shown) that extends along the x-y dimensions. Likewise, the third surface 120 may define a third plane (not shown) that extends along the x-y dimensions. In some embodiments, the photosensor 106 may be disposed proximate the second surface 118 and between the second surface 118 and the third surface 120. Accordingly, the lens holder 102 may at least partially enclose the photosensor 106. For instance, one or more side walls of the lens holder 102 may completely surround the photosensor 106 in the z dimension. As such, the lens holder 102 may protect the photosensor 106 from mechanical contact with other components. Similarly, one or more other components described herein (e.g., the flex circuit board, the stiffener substrate, etc.) may be at least partially enclosed by the lens holder 102.

As will be discussed in further detail below with reference to FIGS. 4 and 5, the photosensor 106 may be oriented such that the photosensor 106 is substantially optically aligned with one or multiple lens elements 104. For instance, the photosensor 106 may be positioned in an aligned position via active alignment, and the photosensor 106 may be coupled to the lens holder 102 in the aligned position. The active alignment may include monitoring at least one optical parameter that is based on the photosensor 106 receiving light that has passed through the lens elements 104. Furthermore, the active alignment may include iteratively adjusting positioning of the photosensor 106 relative to the lens elements 104 until the optical parameter satisfies at least one optical threshold.

In some embodiments, an adhesive may be disposed between at least a portion of the photosensor 106 and at least a portion of the lens holder 102. For instance, the adhesive may be disposed between at least a portion of the photosensor 106 and at least a portion of the third surface 118 of the lens holder 102. In a non-limiting example, the adhesive may be disposed along one or more portions of a first bond line 122. The adhesive may bond the photosensor 106 to the lens holder 102. Additionally or alternatively, the adhesive may function as a seal. For example, the adhesive may provide a light seal and/or a dust seal between the photosensor 106 and the lens elements 104. The bond lines illustrated in FIG. 1, such as the first bond line 122, indicate example regions where the adhesive or other coupling means may be disposed. It should be understood, however, that the adhesive or other coupling means may be disposed in different regions than those illustrated in FIG. 1.

According to various embodiments, the camera module 100 may include a flex circuit board 124. The flex circuit board 124 may be coupled to the photosensor 106 and/or the lens holder 102. The flex circuit board 124 may be configured to receive data/information (e.g., image data) from the photosensor 106 and transmit the data to one or more other components. In some examples, the flex circuit board 124 may be at least partially disposed within the second recess 114. For instance, the flex circuit board 124 may be disposed proximate the photosensor 106. For example, the photosensor 106 may include a first side 126 and a second side 128. The first side 126 of the photosensor 106 may be proximate the lens elements 104. The second side 128 of the photosensor 106 may, in some cases, be located opposite the first side 126. The flex circuit board 124 may be disposed proximate the second side 128 of the photosensor 106. In some embodiments, at least a portion of the flex circuit board 124 may be in contact and/or electrical communication with the photosensor 106. For instance, the second side 128 of the photosensor 106 may include one or more contact elements configured to contact the flex circuit board 124 and transmit data from the photosensor 106 to the flex circuit board 124.

In some embodiments, an adhesive may be disposed between at least a portion of the flex circuit board 124 and at least a portion of the photosensor 106 and/or the lens holder 102. In a non-limiting example, the adhesive may be disposed along one or more portions of a second bond line 130. The adhesive may bond the flex circuit board 124 to the photosensor 106 and/or the lens holder 102.

In some embodiments, the camera module 100 may include a substrate 132. For instance, the substrate 132 may be a stiffener that is coupled to the lens holder 102 and/or the flex circuit board 124. The substrate 132 may function to structurally support and/or protect the flex circuit board 124. In some embodiments, an adhesive may be disposed between at least a portion of the substrate 132 and at least a portion of the flex circuit board 124 and/or the lens holder 102. In a non-limiting example, the adhesive may be disposed along one or more portions of a third bond line 134. The adhesive may bond the substrate 132 to the flex circuit board 124 and/or the lens holder 102.

Furthermore, in some embodiments, the camera module 100 may include a filter 136 (e.g., an infrared filter). In some examples, the filter 136 may be disposed between one or more of the lens elements 104 and the photosensor 106. For instance, the filter 136 may be disposed between the photosensor 106 and the lens element 104 that is closest to the photosensor 106. In other examples, the filter 136 may be a coating that is applied to at least one of the lens elements 104. For instance, a filter coating (e.g., an infrared filter coating) may be applied to the lens element 104 that is closest to the photosensor 106. However, in other embodiments, one or more other lens elements 104, or all of the lens elements 104, may be coated with the filter coating.

The camera module 100 may be designed to have fewer components and/or a smaller form factor than other camera modules. For instance, some other camera modules may include a stack of components (e.g., a filter, a sensor, a flex circuit board, etc.) that are coupled to, but not enclosed within a lens holder that contains lens elements. In other words, the stack of components significantly adds to the z dimension of those camera modules. Furthermore, some of the other camera modules may include an image sensor that is designed to be coupled to a substrate to form a flip chip that allows the image sensor to communicate with another component (e.g., the flex circuit board). The image sensor-substrate combination may have a z dimension that is greater than the z dimension of the photosensors of the camera modules described herein.

The camera module 100, on the other hand, may be designed such that one or more components may be disposed within the lens holder, which reduces certain dimensions as compare to other camera modules. For instance, the photosensor 106 may be a flat, stand-alone component. That is, the photosensor 106, in some embodiments, may not need to be coupled to a substrate to form a flip chip, in contrast to some other camera module designs. Rather, the photosensor 106 may be configured to communicate directly with the flex circuit board 124. For example, the photosensor 106 may include conductive material that allows information to flow from the first side 126 of the photosensor 106 to the second side 128 of the photosensor 106 and to the flex circuit board 124. Thus, the photosensor 106 may be designed to allow for a reduction in the z dimension of the camera module 100 as compared to that of some other camera modules.

In some embodiments, the photosensor 106 may be disposed such that a back focal length (indicated as the bfl dimension in FIG. 1) between the lens elements 104 and the photosensor 106 is between about 100 micrometers and about 200 micrometers. In some instances, the bfl dimension may be less than about 110 micrometers. The bfl dimension may be a distance, in the z dimension, between at least one of the lens elements 104 and the photosensor 106. Due to the design of the photosensor 106 and/or the camera module 100, the bfl dimension may, in some cases, be reduced by about 65% as compared to that of some other camera module designs.

In some embodiments, the camera module 100 may have a z1 dimension. The z1 dimension may be a height (in the z dimension) of the camera module 100. The z1 dimension may be between about 1.5 millimeters and about 4 millimeters. In some instances, the z1 dimension may be less than about 1.8 millimeters.

Furthermore, in some embodiments, the camera module may have a z2 dimension. The z2 dimension may be a height (in the z dimension) of the lens holder 102. For instance, the z2 dimension may be a distance from the first surface 116 to the fourth surface 120. The z2 dimension may be between about 1.4 millimeters and about 3.9 millimeters. In some instances, the z2 dimension may be less than about 1.7 millimeters. Due to the design of the camera module 100, the z2 dimension may, in some cases, be reduced by about 200 micrometers as compared to that of some other camera module designs.

Figure 2:
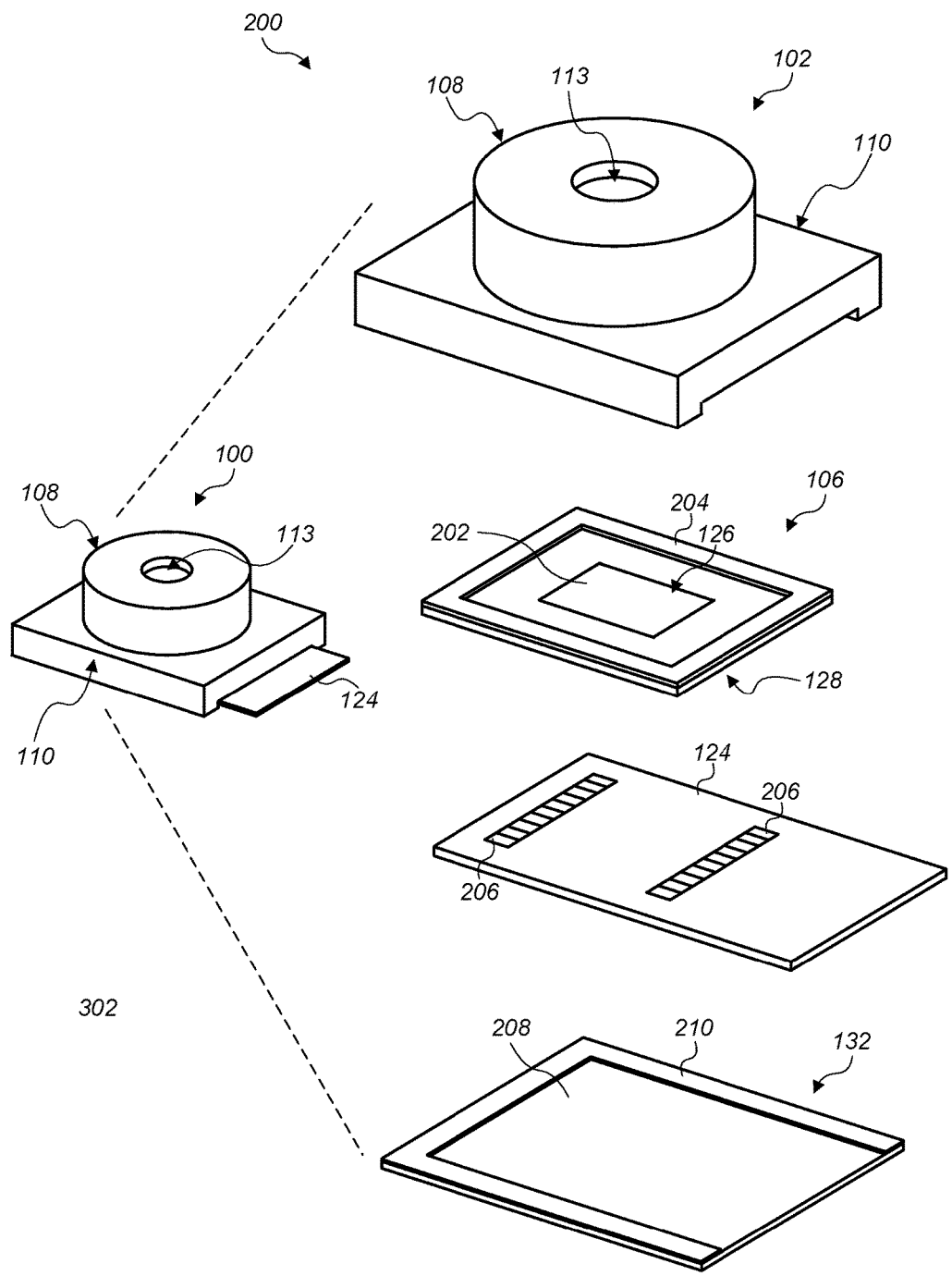
FIG. 2 illustrates an exploded view of an example camera module, in accordance with some embodiments.
Figure 3:
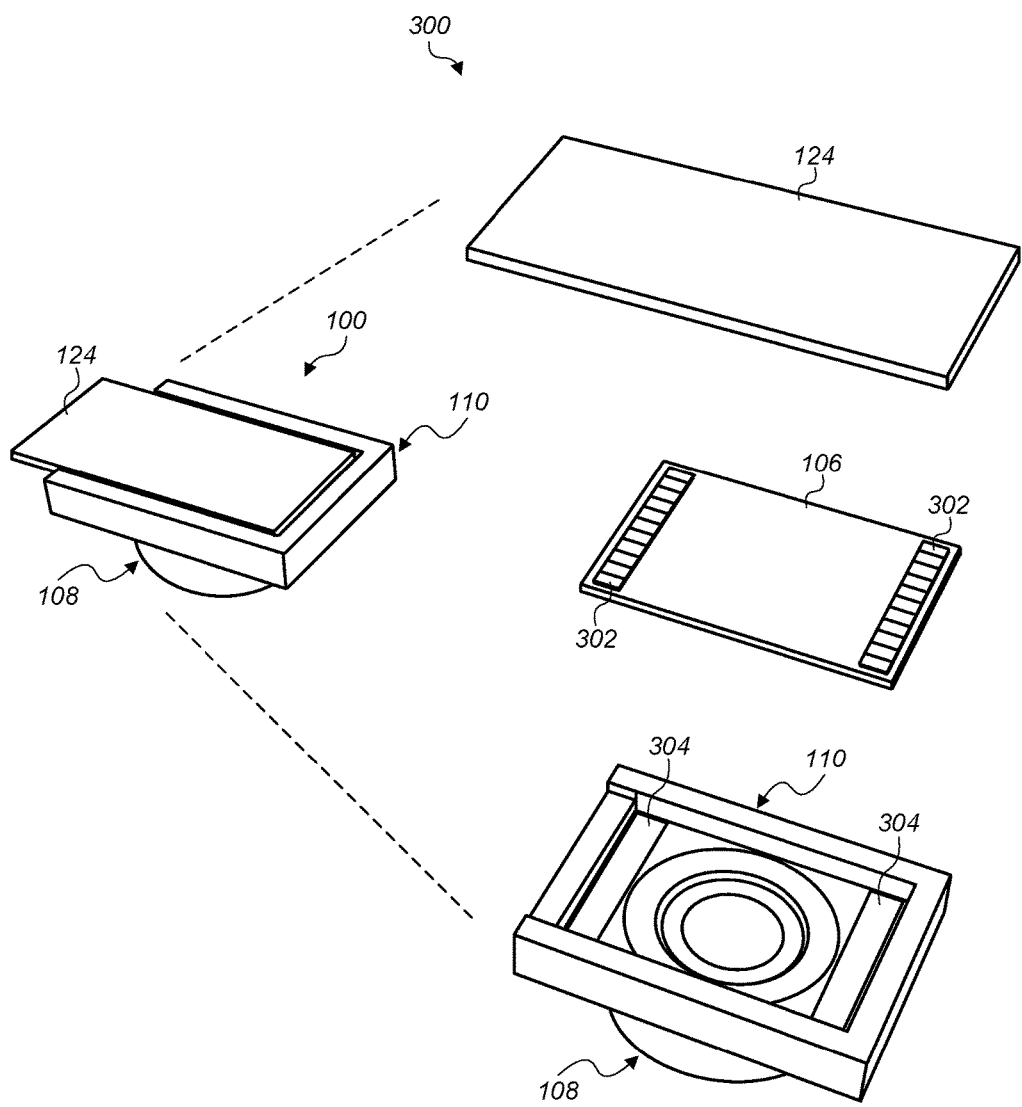
FIG. 3 illustrates another exploded view of an example camera module, in accordance with some embodiments.

FIG. 2 illustrates an exploded view 200 of the example camera module 100, in accordance with some embodiments. FIG. 3 illustrates another exploded view 300 including some of the components of the example camera module 100, according to some embodiments. The exploded view 200 of FIG. 2 shows components of the camera module 100 according to a first perspective view, while the exploded view 300 of FIG. 3 shows components of the camera module 100 according to a second perspective view that is different than the first perspective view. FIG. 2 shows the lens holder 102, the photosensor 106, the flex circuit board 124, and the substrate 132. FIG. 3 shows the lens holder 102, the photosensor 106, and the flex circuit board 124.

As depicted in FIG. 2, the lens holder 102 includes a first portion 108 that is a barrel for receiving one or more lens elements (e.g., lens elements 104 in FIG. 1). Although the first portion 108 is illustrated in FIG. 2 as being cylindrical, the first portion 108 may be any other suitable shape. For instance, the first portion 108 may have a rectangular cross-section in other embodiments. Furthermore, as depicted, the lens holder 102 includes a second portion 110 that is a base structure for receiving one or more other components (e.g., the photosensor 106, the flex circuit board 124, the substrate 132, etc.) of the camera module 100. Although the second portion 110 is illustrated in FIG. 2 as being rectangular, the second portion 110 may be any other suitable shape. For instance, the second portion 110 may have a circular cross-section in other embodiments.

In some embodiments, the lens holder 102 may be constructed of plastics, metals, alloys, and/or any other suitable material(s). For example, the lens holder 102 may be integrally formed of a plastic, e.g., via injection molding. As such, the first portion 108 and the second portion 110 may be a singular component. In other instances, however, the lens holder 102 may be assembled from multiple components. For example, the first portion 108 and the second portion 110 may not be integrally formed, but rather individually formed and then assembled to form at least a portion of the lens holder 102.

In some embodiments, the photosensor 106 may include a charge-coupled device (CCD) or complementary metal-oxide semiconductor (CMOS). However, the photosensor 106 may be constructed from any suitable material(s). For example, in some embodiments, at least a portion of the photosensor 106 may be constructed of one or more plastics.

In some embodiments, the photosensor 106 may include a light or image sensing portion 202 and a coupling portion 204. The light sensing portion 202 may be at the first side 126 (FIG. 1) of the photosensor 106. The light sensing portion 202 may be configured to capture light that passes through the aperture 113. For instance, light rays may pass through the aperture 113 and the lens elements and to the light sensing portion 202 of the photosensor 106. The photosensor 106 may be configured to transmit signals from the light sensing portion 202 to the flex circuit board 124. For instance, the photosensor 106 may include one or more contact elements 302 (FIG. 3) that may be in electrical contact with one or more contact elements 206 of the flex circuit board 124. The one or more contact elements 302 may be disposed on the second side 128 (FIG. 1) of the photosensor 106. The photosensor 106 may include conductive material that provides for conveying the signals from the light sensing portion 202 to the contact elements 302, which may themselves include conductive material that provides for conveying the signals to the flex circuit board 124. In some examples, the photosensor 106 may include at least one vertical interconnect access (VIA) within the photosensor 106 for transmitting the signals from the first side 126 to the second side 128.

In various embodiments, the photosensor 106 may be configured to transmit signals directly from the first side 126 to the second side 128. That is, the photosensor 106 may be configured to transmit signals from the first side 126 to the second side 128 without routing the signals through an external, separate, and/or intervening component. Furthermore, the photosensor 106 and/or the flex circuit board 124 may be configured such that signals may be transmitted directly from the photosensor 106 to the flex circuit board 124. That is, the signals may be transmitted from the photosensor 106 to the flex circuit board 124 without routing the signals through an external, separate, and/or intervening component. For instance, the photosensor 106 does not need to be coupled to a substrate through which signals are routed from the light sensing portion 202 to the flex circuit board 124. Without such an intervening component, certain dimensions (e.g., the BFL, z1, and z2 dimensions discussed above) may be reduced, thus resulting in a smaller form factor.

The coupling portion 204 of the photosensor 106 may indicate a portion of the photosensor 106 that is bonded to the lens holder 102. For instance, at least a portion of the coupling portion 204 may be bonded to coupling portion 304 (FIG. 3) of the lens holder 102. In some examples, an adhesive may be placed on at least a portion of the coupling portion 204 of the photosensor 106 and/or at least a portion of the coupling portion 304 of the lens holder 102. In this manner, the photosensor 106 may be bonded to the lens holder 102.

In some embodiments, the substrate 132 may include a first portion 208 and a second portion 210. The first portion 208 may be configured to receive the flex circuit board 124. That is, at least a portion of the flex circuit board 124 may sit on, or proximate to, the first portion 208. The second portion 210 may be a lip formed along at least a portion of the perimeter of the first portion 208. In some examples, the second portion 210 may be coupled to the lens holder 102. For instance, at least a portion of the second portion 210 may be bonded to at least a portion of the third surface 120 (FIG. 1) of the lens holder 102. Additionally or alternatively, at least a portion of the substrate 132 may be bonded to at least a portion of the flex circuit board 124.

Figure 4:
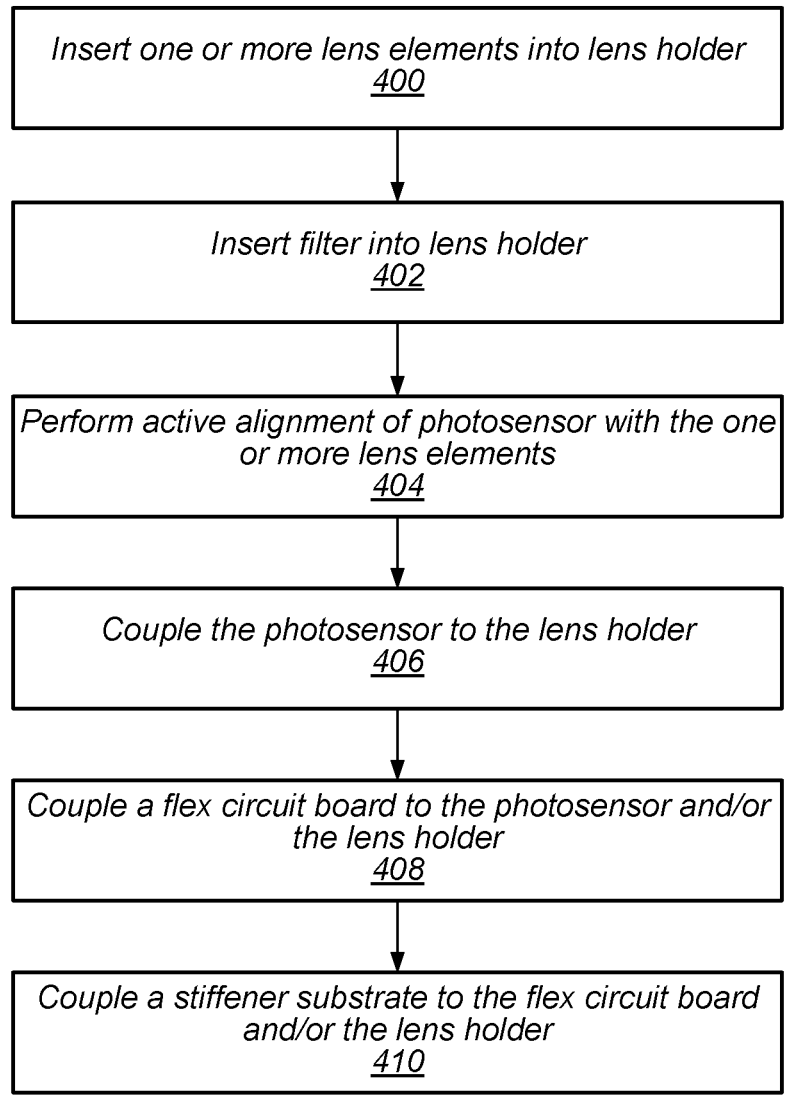
FIG. 4 is a flowchart of an example method for manufacturing a camera module, in accordance with some embodiments.

FIG. 4 is a flowchart of an example method for manufacturing a camera module, according to some embodiments. For instance, the example method may be used for manufacturing and/or assembling the camera modules described herein, e.g., in the discussion above with reference to FIGS. 1-3.

At 400, one or more lens elements may be inserted into a lens holder. For instance, the lens holder may include a first portion that defines a first recess for receiving the lens elements. The lens elements may be placed at least partially within the first recess and bonded to the first portion, to another portion of the lens holder, and/or to one another. For example, glue (or another adhesive) may be used to bond the lens elements in a desired position within the lens holder. In some embodiments, the camera module may be a fixed focus camera module. Accordingly, the lens elements may be coupled to the lens holder such that they are fixed in a desired position relative to a photosensor. In this manner, the positioning of some components of the camera module may not be dynamically adjusted for optical focusing purposes after assembly. In other embodiments, however, the camera module may be an autofocus (AF) camera module that includes components capable of being dynamically adjusted for optical focusing purposes after assembly.

At 402, one or more filters may be inserted into the lens holder. For instance, one or more filters may be placed at least partially within the first recess and bonded to the first portion, to another portion of the lens holder, to one or more lens elements, and/or to one another. In some cases, glue (or another adhesive) may be used to bond the filter in a desired position within the lens holder.

According to some implementations, the method may include receiving the lens holder with the lens elements and/or other components (e.g., a filter) already coupled to the lens holder.

At 404, the method may include performing active alignment of an image sensor with the one or more lens elements. For instance, the active alignment may include positioning the photosensor relative to the one or more lens elements.

The active alignment process is discussed in further detail below with reference to FIG. 5.

At 406, the photosensor may be coupled to the lens holder. For instance, the lens holder may include a second portion that defines a second recess for receiving the photosensor. The photosensor may be placed at least partially within the first recess and bonded to the second portion, to the first portion, and/or to another portion of the lens holder. For example, glue (or another adhesive) may be used to bond the photosensor in a desired position within the lens holder. In some examples, the photosensor may be glued to at least a portion of an inner surface of the lens holder. For instance, the inner surface may define a plane that extends in the x-y dimensions. The first recess may be located above the plane, and the second recess may be located below the plane. In some instances, the plane may define a transition, in the z dimension, from the first recess to the second recess.

In various embodiments, an adhesive may be placed between at least a portion of the photosensor and at least a portion of the lens holder. The photosensor may be placed in an aligned position via active alignment prior to the adhesive being cured. After performing the active alignment, the adhesive may be cured to fix the photosensor in the aligned position.

The adhesive may be placed between the photosensor and the lens holder such that the adhesive functions as a seal. For instance, the adhesive may function as a light seal that prevents light from passing between the photosensor and the lens holder and to the lens elements during active alignment, which may provide for improved alignment and thus improved optical performance.

Furthermore, the method may provide for fewer opportunities for dust particles to reach the light sensing portion of the photosensor and/or the lens elements as compared to some methods for manufacturing other camera modules. The camera modules described herein may be designed to have fewer components to assemble, a simpler assembly method and/or a simpler manufacturing method than other camera modules. For example, as discussed above with reference to FIG. 2, the photosensor may be configured to transmit signals directly to the flex circuit board without routing the signals through an intervening component. Some other camera module designs include a photosensor that is coupled to substrate through which the signals are routed to the flex circuit board. Those other camera module designs do not allow for fixing the photosensor directly to the lens holder. Rather than applying an adhesive between the photosensor and the lens holder before the active alignment and curing the adhesive after the active alignment, those other camera module designs require underfilling a gap between the lens holder and the photosensor-substrate combination after the photosensor-substrate combination is oriented in a desired position. The additional components and additional steps involved in manufacturing and/or assembling the other camera module designs provide opportunities for dust particles to be shed and possibly affecting optical performance.

At 408, the flex circuit board may be coupled to the photosensor and/or the lens holder. In some cases, the flex circuit board may be placed at least partially within the second recess. In some embodiments, the flex circuit board may be placed proximate the photosensor and bonded to the photosensor and/or the lens holder such that the flex circuit board is fixed proximate the flex circuit board. For example, glue (or another adhesive) may be used to bond the flex circuit board in a desired position.

In some embodiments, the flex circuit board may be disposed such that at least a portion of the flex circuit board is in contact with at least a portion of the photosensor. For instance, the photosensor may include one or multiple contact elements that may be in electrical contact with at least a portion of the flex circuit board. In this manner, the flex circuit board may be capable of receiving image information from the photosensor. The flex circuit board may be configured to transmit the image information to one or more other components (e.g., one or more components of a device hosting the camera module).

In some implementations, the flex circuit board may be coupled to the photosensor and/or the lens holder during a time period after the photosensor is coupled to the lens holder. However, in other implementations, the flex circuit board may be coupled to the photosensor during a time period before the photosensor is coupled to the lens holder. That is, the flex circuit board may be coupled to the photosensor to produce a subassembly. The subassembly may then be coupled to the lens holder.

At 410, a stiffener substrate may be coupled to the flex circuit board and/or the lens holder. The stiffener substrate may function to provide structural support and/or protection to the flex circuit board, the lens holder, and/or another component of the camera module. In some examples, the stiffener substrate may be placed proximate the flex circuit board and bonded to the flex circuit board and/or the lens holder such that the stiffener substrate is fixed proximate the flex circuit board. For example, glue (or another adhesive) may be used to bond the stiffener substrate in a desired position. In some implementations, the stiffener substrate may be disposed at least partially within the lens holder. For example, the stiffener substrate may be disposed at least partially within the second recess. In other examples, however, the stiffener substrate may wholly be disposed outside the lens holder.

In some embodiments, at least some of the components of the camera module may be manufactured and/or assembled by different entities (e.g., vendors for the different components) at different locations, and assembly of components and/or subassemblies of the camera module may be performed by an entity at a facility that assembles a device (e.g., a mobile device) that includes the camera module.

Figure 5:
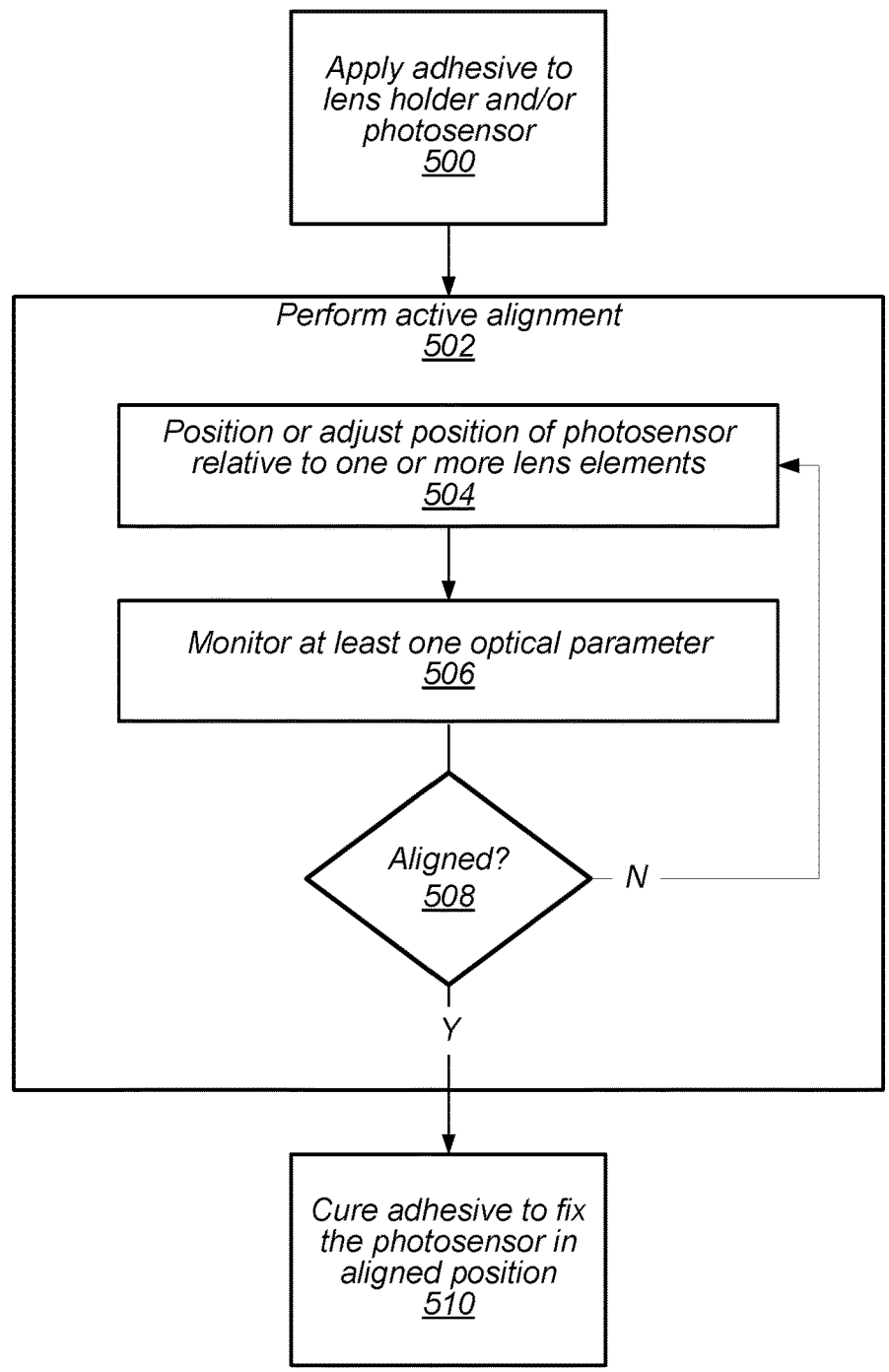
FIG. 5 is a flowchart of an example method for performing active alignment for a camera module, in accordance with some embodiments.

FIG. 5 is a flowchart of an example method for performing active alignment for a camera module, according to some embodiments. For instance, the example method may be used for aligning the photosensor of the camera modules described herein, e.g., in the discussion above with reference to FIGS. 1-3.

At 500, an adhesive may be applied to a lens holder and/or a photosensor, as discussed in further detail above with reference to FIGS. 1-4. At 502, the method may include performing active alignment of the photosensor with one or more lens elements. For instance, at 504, the active alignment may include positioning the photosensor relative to the one or more lens elements. At 506, at least one optical parameter (e.g., focus of an image) may be monitored. In some implementations, the at least one optical parameter may be based on the photosensor receiving light that has passed through the one or more lens elements. Furthermore, the active alignment may include iteratively adjusting the positioning of the photosensor relative to the one or more lens elements. The positioning of the photosensor may, in some cases, be iteratively adjusted until a triggering event occurs. For example, the positioning of the photosensor may be iteratively adjusted (e.g., along 5 or 6 degrees of freedom) until at least one optical parameter satisfies at least one optical threshold. The triggering event may indicate that the photosensor is in an aligned position relative to the one or more elements. In some cases, the one or more lens elements may define an optical axis. The photosensor, when in the aligned position, may be oriented such that it is substantially optically aligned with the optical axis. In some embodiments, the active alignment may insure that the alignment and relative position of the photosensor to the lens elements in the x, y, and/or z dimensions is correct according to specifications and within tolerances of the camera module, and to maximize camera system performance and yield. In some embodiments, the active alignment includes doing z alignment of the photosensor to find optimal focus, and then performing x and y tilt of the image plane to find optimal field performance.

At 508, the method includes determining whether the photosensor is in the aligned position. If, at 508, it is determined that the photosensor is not in the aligned position, then the positioning of the photosensor may be adjusted, at 504, as part of the iterative adjustment discussed above.

If, at 508, it is determined that the photosensor is in the aligned position, then the adhesive may be cured to fix the photosensor in the aligned position, at 510.

Example Portable Multifunction Devices

Embodiments of electronic devices, user interfaces for such devices, and associated processes for using such devices are described. In some embodiments, the device is a portable communications device, such as a mobile telephone, that also contains other functions, such as PDA and/or music player functions. Other portable electronic devices, such as laptops, cameras, cell phones, or tablet computers, may also be used. It should also be understood that, in some embodiments, the device is not a portable communications device, but is a desktop computer with a camera. In other embodiments, the device is not a portable communications device, but is a camera.

In the discussion that follows, an electronic device that includes a display and a touch-sensitive surface is described. It should be understood, however, that the electronic device may include one or more other physical user-interface devices, such as a physical keyboard, a mouse and/or a joystick.

The device typically supports a variety of applications, such as one or more of the following: a drawing application, a presentation application, a word processing application, a website creation application, a disk authoring application, a spreadsheet application, a gaming application, a telephone application, a video conferencing application, an e-mail application, an instant messaging application, a workout support application, a photo management application, a digital camera application, a digital video camera application, a web browsing application, a digital music player application, and/or a digital video player application.

The various applications that may be executed on the device may use at least one common physical user-interface device, such as the touch-sensitive surface. One or more functions of the touch-sensitive surface as well as corresponding information displayed on the device may be adjusted and/or varied from one application to the next and/or within a respective application. In this way, a common physical architecture (such as the touch-sensitive surface) of the device may support the variety of applications with user interfaces that are intuitive and transparent to the user.

Figure 6:
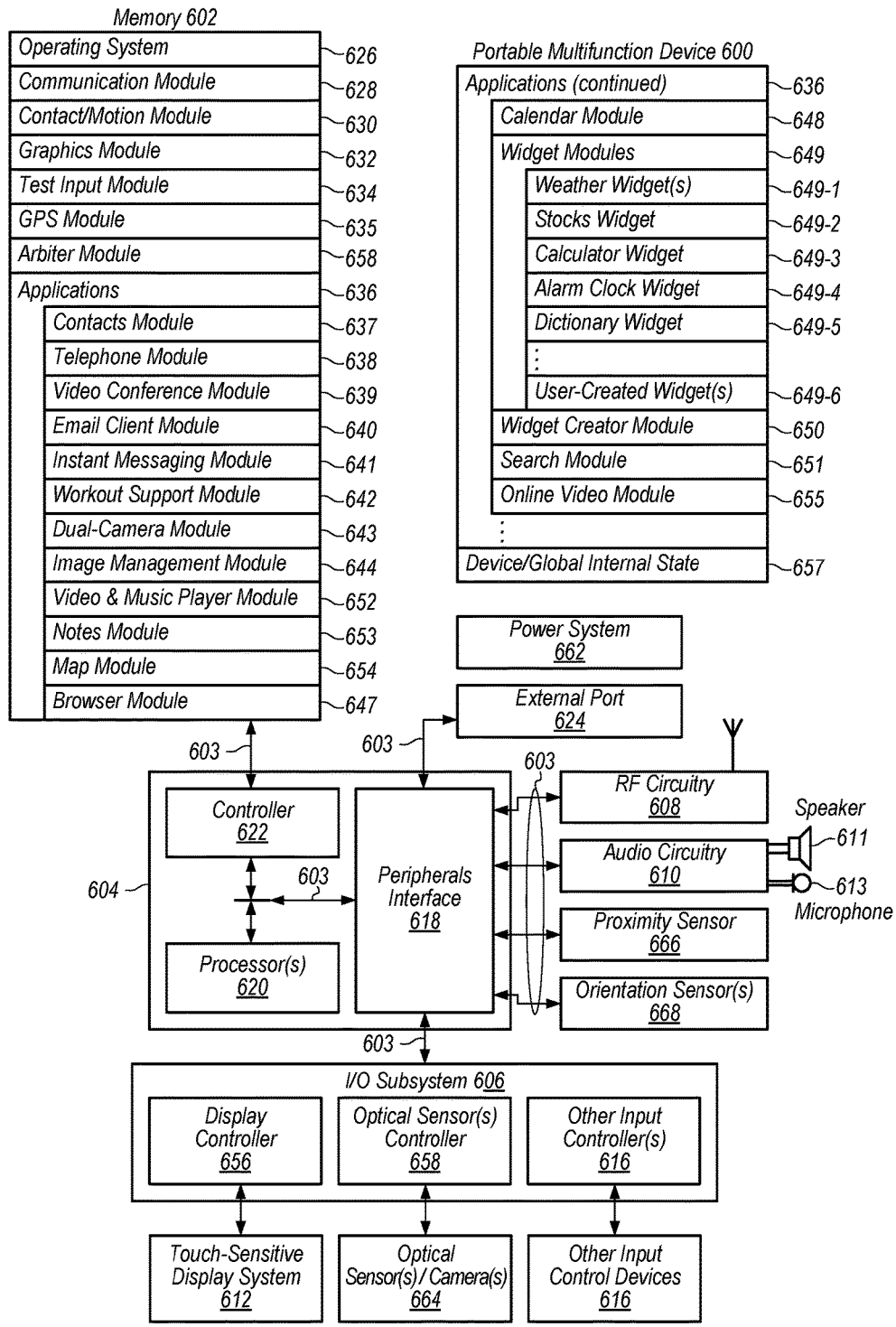
FIG. 6 illustrates a block diagram of an example portable multifunction device that may include or host one or more camera modules, in accordance with some embodiments.

FIG. 6 is a block diagram illustrating a portable multifunction device 600 that may include or host embodiments of one or more camera modules disclosed herein, e.g., in the discussion above with reference to FIGS. 1-5. For example, device 600 may include cameras 664a-b, which may include one or more camera modules, in some embodiments. Cameras 664a-b are sometimes called "optical sensors" for convenience, and may also be known as or called an optical sensor system. Device 600 may include memory 602 (which may include one or more computer readable storage mediums), memory controller 622, one or more processing units (CPUs) 620, peripherals interface 618, RF circuitry 608, audio circuitry 610, speaker 611, touch-sensitive display system 612, microphone 613, input/output (I/O) subsystem 606, other input or control devices 616, and external port 624. Device 600 may include optical sensors 664a-b. These components may communicate over one or more communication buses or signal lines 603.

It should be appreciated that device 600 is only one example of a portable multifunction device, and that device 600 may have more or fewer components than shown, may combine two or more components, or may have a different configuration or arrangement of the components. The various components shown in various of the figures may be implemented in hardware, software, or a combination of hardware and software, including one or more signal processing and/or application specific integrated circuits.

Memory 602 may include high-speed random access memory and may also include non-volatile memory, such as one or more magnetic disk storage devices, flash memory devices, or other non-volatile solid-state memory devices. Access to memory 602 by other components of device 600, such as CPU 620 and the peripherals interface 618, may be controlled by memory controller 622.

Peripherals interface 618 can be used to couple input and output peripherals of the device to CPU 620 and memory 602. The one or more processors 620 run or execute various software programs and/or sets of instructions stored in memory 602 to perform various functions for device 600 and to process data.

In some embodiments, peripherals interface 618, CPU 620, and memory controller 622 may be implemented on a single chip, such as chip 604. In some other embodiments, they may be implemented on separate chips.

RF (radio frequency) circuitry 608 receives and sends RF signals, also called electromagnetic signals. RF circuitry 608 converts electrical signals to/from electromagnetic signals and communicates with communications networks and other communications devices via the electromagnetic signals. RF circuitry 608 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 608 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSUPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 610, speaker 611, and microphone 613 provide an audio interface between a user and device 600. Audio circuitry 610 receives audio data from peripherals interface 618, converts the audio data to an electrical signal, and transmits the electrical signal to speaker 611. Speaker 611 converts the electrical signal to human-audible sound waves. Audio circuitry 610 also receives electrical signals converted by microphone 613 from sound waves. Audio circuitry 610 converts the electrical signal to audio data and transmits the audio data to peripherals interface 618 for processing. Audio data may be retrieved from and/or transmitted to memory 602 and/or RF circuitry 608 by peripherals interface 618. In some embodiments, audio circuitry 610 also includes a headset jack (e.g., 712, FIG. 7). The headset jack provides an interface between audio circuitry 610 and removable audio input/output peripherals, such as output-only headphones or a headset with both output (e.g., a headphone for one or both ears) and input (e.g., a microphone).

I/O subsystem 606 couples input/output peripherals on device 600, such as touch screen 612 and other input control devices 616, to peripherals interface 618. I/O subsystem 606 may include display controller 656 and one or more input controllers 660 for other input or control devices. The one or more input controllers 660 receive/send electrical signals from/to other input or control devices 616. The other input control devices 616 may include physical buttons (e.g., push buttons, rocker buttons, etc.), dials, slider switches, joysticks, click wheels, and so forth. In some alternate embodiments, input controller(s) 660 may be coupled to any (or none) of the following: a keyboard, infrared port, USB port, and a pointer device such as a mouse. The one or more buttons (e.g., 708, FIG. 7) may include an up/down button for volume control of speaker 611 and/or microphone 613. The one or more buttons may include a push button (e.g., 706, FIG. 7).

Touch-sensitive display 612 provides an input interface and an output interface between the device and a user. Display controller 656 receives and/or sends electrical signals from/to touch screen 612. Touch screen 612 displays visual output to the user. The visual output may include graphics, text, icons, video, and any combination thereof (collectively termed "graphics"). In some embodiments, some or all of the visual output may correspond to user-interface objects.

Touch screen 612 has a touch-sensitive surface, sensor or set of sensors that accepts input from the user based on haptic and/or tactile contact. Touch screen 612 and display controller 656 (along with any associated modules and/or sets of instructions in memory 602) detect contact (and any movement or breaking of the contact) on touch screen 612 and converts the detected contact into interaction with user-interface objects (e.g., one or more soft keys, icons, web pages or images) that are displayed on touch screen 612. In an example embodiment, a point of contact between touch screen 612 and the user corresponds to a finger of the user.

Touch screen 612 may use LCD (liquid crystal display) technology, LPD (light emitting polymer display) technology, or LED (light emitting diode) technology, although other display technologies may be used in other embodiments. Touch screen 612 and display controller 656 may detect contact and any movement or breaking thereof using any of a variety of touch sensing technologies now known or later developed, including but not limited to capacitive, resistive, infrared, and surface acoustic wave technologies, as well as other proximity sensor arrays or other elements for determining one or more points of contact with touch screen 612. In an example embodiment, projected mutual capacitance sensing technology is used, such as that found in the iPhone®, iPod Touch®, and iPad® from Apple Inc. of Cupertino, Calif.

Touch screen 612 may have a video resolution in excess of 100 dpi. In some embodiments, the touch screen has a video resolution of approximately 160 dpi. The user may make contact with touch screen 612 using any suitable object or appendage, such as a stylus, a finger, and so forth. In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions calculated by the user.

In some embodiments, in addition to the touch screen, device 600 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 612 or an extension of the touch-sensitive surface formed by the touch screen.

Device 600 also includes power system 662 for powering the various components. Power system 662 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 600 may also include optical sensors or cameras 664a-b. Optical sensors 664a-b may include charge-coupled device (CCD) or complementary metal-oxide semiconductor (CMOS) phototransistors. Optical sensors 664a-b receive light from the environment, projected through one or more lens, and converts the light to data representing an image. In conjunction with imaging module 643, optical sensors 664a-b may capture still images or video. In some embodiments, an optical sensor is located on the back of device 600, opposite touch screen display 612 on the front of the device, so that the touch screen display may be used as a viewfinder for still and/or video image acquisition. In some embodiments, another optical sensor is located on the front of the device so that the user's image may be obtained for videoconferencing while the user views the other video conference participants on the touch screen display. In embodiments in which multiple cameras or optical sensors 664a-b are supported, each of the multiple cameras or optical sensors 664a-b may include its own photosensor(s), or the multiple cameras or optical sensors 664a-b may be supported by a shared photosensor. Likewise, in embodiments in which multiple cameras or optical sensors 664a-b are supported, each of the multiple cameras or optical sensors 664a-b may include its own image processing pipeline of processors and storage units, or the multiple cameras or optical sensors 664a-b may be supported by an image processing pipeline of processors and storage units.

Device 600 may also include one or more proximity sensors 666. FIG. 6 shows proximity sensor 666 coupled to peripherals interface 618. Alternately, proximity sensor 666 may be coupled to input controller 660 in I/O subsystem 606. In some embodiments, the proximity sensor 666 turns off and disables touch screen 612 when the multifunction device is placed near the user's ear (e.g., when the user is making a phone call).

Device 600 includes one or more orientation sensors 668. In some embodiments, the one or more orientation sensors include one or more accelerometers (e.g., one or more linear accelerometers and/or one or more rotational accelerometers). In some embodiments, the one or more orientation sensors include one or more gyroscopes. In some embodiments, the one or more orientation sensors include one or more magnetometers. In some embodiments, the one or more orientation sensors include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 600. In some embodiments, the one or more orientation sensors include any combination of orientation/rotation sensors. FIG. 6 shows the one or more orientation sensors 668 coupled to peripherals interface 618. Alternately, the one or more orientation sensors 668 may be coupled to an input controller 660 in I/O subsystem 606. In some embodiments, information is displayed on the touch screen display in a portrait view or a landscape view based on an analysis of data received from the one or more orientation sensors.

In some embodiments, the software components stored in memory 602 include operating system 626, communication module (or set of instructions) 628, contact/motion module (or set of instructions) 630, graphics module (or set of instructions) 632, text input module (or set of instructions) 634, Global Positioning System (GPS) module (or set of instructions) 635, arbiter module 657 and applications (or sets of instructions) 636. Furthermore, in some embodiments memory 602 stores device/global internal state 657. Device/global internal state 657 includes one or more of: active application state, indicating which applications, if any, are currently active; display state, indicating what applications, views or other information occupy various regions of touch screen display 612; sensor state, including information obtained from the device's various sensors and input control devices 616; and location information concerning the device's location and/or attitude.

Operating system 626 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 628 facilitates communication with other devices over one or more external ports 624 and also includes various software components for handling data received by RF circuitry 608 and/or external port 624. External port 624 (e.g., Universal Serial Bus (USB), FIREWIRE, etc.) is adapted for coupling directly to other devices or indirectly over a network (e.g., the Internet, wireless LAN, etc.). In some embodiments, the external port is a multi-pin (e.g., 30-pin) connector that is the same as, or similar to and/or compatible with the 30-pin connector used on iPod (trademark of Apple Inc.) devices.

Contact/motion module 630 may detect contact with touch screen 612 (in conjunction with display controller 656) and other touch sensitive devices (e.g., a touchpad or physical click wheel). Contact/motion module 630 includes various software components for performing various operations related to detection of contact, such as determining if contact has occurred (e.g., detecting a finger-down event), determining if there is movement of the contact and tracking the movement across the touch-sensitive surface (e.g., detecting one or more finger-dragging events), and determining if the contact has ceased (e.g., detecting a finger-up event or a break in contact). Contact/motion module 630 receives contact data from the touch-sensitive surface. Determining movement of the point of contact, which is represented by a series of contact data, may include determining speed (magnitude), velocity (magnitude and direction), and/or an acceleration (a change in magnitude and/or direction) of the point of contact. These operations may be applied to single contacts (e.g., one finger contacts) or to multiple simultaneous contacts (e.g., "multitouch"/multiple finger contacts). In some embodiments, contact/motion module 630 and display controller 656 detect contact on a touchpad.

Contact/motion module 630 may detect a gesture input by a user. Different gestures on the touch-sensitive surface have different contact patterns. Thus, a gesture may be detected by detecting a particular contact pattern. For example, detecting a finger tap gesture includes detecting a finger-down event followed by detecting a finger-up (lift off) event at the same position (or substantially the same position) as the finger-down event (e.g., at the position of an icon). As another example, detecting a finger swipe gesture on the touch-sensitive surface includes detecting a finger-down event followed by detecting one or more finger-dragging events, and subsequently followed by detecting a finger-up (lift off) event.

Graphics module 632 includes various known software components for rendering and displaying graphics on touch screen 612 or other display, including components for changing the intensity of graphics that are displayed. As used herein, the term "graphics" includes any object that can be displayed to a user, including without limitation text, web pages, icons (such as user-interface objects including soft keys), digital images, videos, animations and the like.

In some embodiments, graphics module 632 stores data representing graphics to be used. Each graphic may be assigned a corresponding code. Graphics module 632 receives, from applications etc., one or more codes specifying graphics to be displayed along with, if necessary, coordinate data and other graphic property data, and then generates screen image data to output to display controller 656.

Text input module 634, which may be a component of graphics module 632, provides soft keyboards for entering text in various applications (e.g., contacts 637, e-mail 640, IM 641, browser 647, and any other application that needs text input).

GPS module 635 determines the location of the device and provides this information for use in various applications (e.g., to telephone 638 for use in location-based dialing, to camera 643 as picture/video metadata, and to applications that provide location-based services such as weather widgets, local yellow page widgets, and map/navigation widgets).

Applications 636 may include the following modules (or sets of instructions), or a subset or superset thereof:

contacts module 637 (sometimes called an address book or contact list);
telephone module 638;
video conferencing module 639;
e-mail client module 640;
instant messaging (IM) module 641;
workout support module 642;
dual camera module 643 for still and/or video images;
image management module 644;
browser module 647;
calendar module 648;
widget modules 649, which may include one or more of: weather widget 649-1, stocks widget 649-2, calculator widget 649-3, alarm clock widget 649-4, dictionary widget 649-5, and other widgets obtained by the user, as well as user-created widgets 649-6;
widget creator module 650 for making user-created widgets 649-6;
search module 651;
video and music player module 652, which may be made up of a video player module and a music player module;
notes module 653;
map module 654; and/or
online video module 655.

Examples of other applications 636 that may be stored in memory 602 include other word processing applications, other image editing applications, drawing applications, presentation applications, JAVA-enabled applications, encryption, digital rights management, voice recognition, and voice replication.

In conjunction with touch screen 612, display controller 656, contact module 630, graphics module 632, and text input module 634, contacts module 637 may be used to manage an address book or contact list (e.g., stored in application internal state 692 of contacts module 637 in memory 602 or memory 670), including: adding name(s) to the address book; deleting name(s) from the address book; associating telephone number(s), e-mail address(es), physical address(es) or other information with a name; associating an image with a name; categorizing and sorting names; providing telephone numbers or e-mail addresses to initiate and/or facilitate communications by telephone 638, video conference 639, e-mail 640, or IM 641; and so forth.

In conjunction with RF circuitry 608, audio circuitry 610, speaker 611, microphone 613, touch screen 612, display controller 656, contact module 630, graphics module 632, and text input module 634, telephone module 638 may be used to enter a sequence of characters corresponding to a telephone number, access one or more telephone numbers in address book 637, modify a telephone number that has been entered, dial a respective telephone number, conduct a conversation and disconnect or hang up when the conversation is completed. As noted above, the wireless communication may use any of a variety of communications standards, protocols and technologies.

In conjunction with RF circuitry 608, audio circuitry 610, speaker 611, microphone 613, touch screen 612, display controller 656, optical sensors 664a-b, optical sensor controller 658, contact module 630, graphics module 632, text input module 634, contact list 637, and telephone module 638, videoconferencing module 639 includes executable instructions to initiate, conduct, and terminate a video conference between a user and one or more other participants in accordance with user instructions.

In conjunction with RF circuitry 608, touch screen 612, display controller 656, contact module 630, graphics module 632, and text input module 634, e-mail client module 640 includes executable instructions to create, send, receive, and manage e-mail in response to user instructions. In conjunction with image management module 644, e-mail client module 640 makes it very easy to create and send e-mails with still or video images taken with dual camera module 643.

In conjunction with RF circuitry 608, touch screen 612, display controller 656, contact module 630, graphics module 632, and text input module 634, the instant messaging module 641 includes executable instructions to enter a sequence of characters corresponding to an instant message, to modify previously entered characters, to transmit a respective instant message (for example, using a Short Message Service (SMS) or Multimedia Message Service (MMS) protocol for telephony-based instant messages or using XMPP, SIMPLE, or IMPS for Internet-based instant messages), to receive instant messages and to view received instant messages. In some embodiments, transmitted and/or received instant messages may include graphics, photos, audio files, video files and/or other attachments as are supported in a MMS and/or an Enhanced Messaging Service (EMS). As used herein, "instant messaging" refers to both telephony-based messages (e.g., messages sent using SMS or MMS) and Internet-based messages (e.g., messages sent using XMPP, SIMPLE, or IMPS).

In conjunction with RF circuitry 608, touch screen 612, display controller 656, contact module 630, graphics module 632, text input module 634, GPS module 635, map module 654, and music player module 646, workout support module 642 includes executable instructions to create workouts (e.g., with time, distance, and/or calorie burning goals); communicate with workout sensors (sports devices); receive workout sensor data; calibrate sensors used to monitor a workout; select and play music for a workout; and display, store and transmit workout data.

In conjunction with touch screen 612, display controller 656, optical sensor(s) 664, optical sensor controller 658, contact module 630, graphics module 632, and image management module 644, dual camera module 643 includes executable instructions to capture still images or video (including a video stream) and store them into memory 602, modify characteristics of a still image or video, or delete a still image or video from memory 602.

In conjunction with touch screen 612, display controller 656, contact module 630, graphics module 632, text input module 634, and dual camera module 643, image management module 644 includes executable instructions to arrange, modify (e.g., edit), or otherwise manipulate, label, delete, present (e.g., in a digital slide show or album), and store still and/or video images.

In conjunction with RF circuitry 608, touch screen 612, display system controller 656, contact module 630, graphics module 632, and text input module 634, browser module 647 includes executable instructions to browse the Internet in accordance with user instructions, including searching, linking to, receiving, and displaying web pages or portions thereof, as well as attachments and other files linked to web pages.

In conjunction with RF circuitry 608, touch screen 612, display system controller 656, contact module 630, graphics module 632, text input module 634, e-mail client module 640, and browser module 647, calendar module 648 includes executable instructions to create, display, modify, and store calendars and data associated with calendars (e.g., calendar entries, to do lists, etc.) in accordance with user instructions.

In conjunction with RF circuitry 608, touch screen 612, display system controller 656, contact module 630, graphics module 632, text input module 634, and browser module 647, widget modules 649 are mini-applications that may be downloaded and used by a user (e.g., weather widget 649-1, stocks widget 649-2, calculator widget 6493, alarm clock widget 649-4, and dictionary widget 649-5) or created by the user (e.g., user-created widget 649-6). In some embodiments, a widget includes an HTML (Hypertext Markup Language) file, a CSS (Cascading Style Sheets) file, and a JavaScript file. In some embodiments, a widget includes an XML (Extensible Markup Language) file and a JavaScript file (e.g., Yahoo! Widgets).

In conjunction with RF circuitry 608, touch screen 612, display system controller 656, contact module 630, graphics module 632, text input module 634, and browser module 647, the widget creator module 650 may be used by a user to create widgets (e.g., turning a user-specified portion of a web page into a widget).

In conjunction with touch screen 612, display system controller 656, contact module 630, graphics module 632, and text input module 634, search module 651 includes executable instructions to search for text, music, sound, image, video, and/or other files in memory 102 that match one or more search criteria (e.g., one or more user-specified search terms) in accordance with user instructions.

In conjunction with touch screen 612, display system controller 656, contact module 630, graphics module 632, audio circuitry 610, speaker 611, RF circuitry 608, and browser module 647, video and music player module 652 includes executable instructions that allow the user to download and play back recorded music and other sound files stored in one or more file formats, such as MP3 or AAC files, and executable instructions to display, present or otherwise play back videos (e.g., on touch screen 612 or on an external, connected display via external port 624). In some embodiments, device 600 may include the functionality of an MP3 player, such as an iPod (trademark of Apple Inc.).

In conjunction with touch screen 612, display controller 656, contact module 630, graphics module 632, and text input module 634, notes module 653 includes executable instructions to create and manage notes, to do lists, and the like in accordance with user instructions.

In conjunction with RF circuitry 608, touch screen 612, display system controller 656, contact module 630, graphics module 632, text input module 634, GPS module 635, and browser module 647, map module 654 may be used to receive, display, modify, and store maps and data associated with maps (e.g., driving directions; data on stores and other points of interest at or near a particular location; and other location-based data) in accordance with user instructions.

In conjunction with touch screen 612, display system controller 656, contact module 630, graphics module 632, audio circuitry 610, speaker 611, RF circuitry 608, text input module 634, e-mail client module 640, and browser module 647, online video module 655 includes instructions that allow the user to access, browse, receive (e.g., by streaming and/or download), play back (e.g., on the touch screen or on an external, connected display via external port 624), send an e-mail with a link to a particular online video, and otherwise manage online videos in one or more file formats, such as H.264. In some embodiments, instant messaging module 641, rather than e-mail client module 640, is used to send a link to a particular online video.

Each of the above identified modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, memory 602 may store a subset of the modules and data structures identified above. Furthermore, memory 602 may store additional modules and data structures not described above.

In some embodiments, device 600 is a device where operation of a predefined set of functions on the device is performed exclusively through a touch screen and/or a touchpad. By using a touch screen and/or a touchpad as the primary input control device for operation of device 600, the number of physical input control devices (such as push buttons, dials, and the like) on device 600 may be reduced.

The predefined set of functions that may be performed exclusively through a touch screen and/or a touchpad include navigation between user interfaces. In some embodiments, the touchpad, when touched by the user, navigates device 600 to a main, home, or root menu from any user interface that may be displayed on device 600. In such embodiments, the touchpad may be referred to as a "menu button." In some other embodiments, the menu button may be a physical push button or other physical input control device instead of a touchpad.

Figure 7:
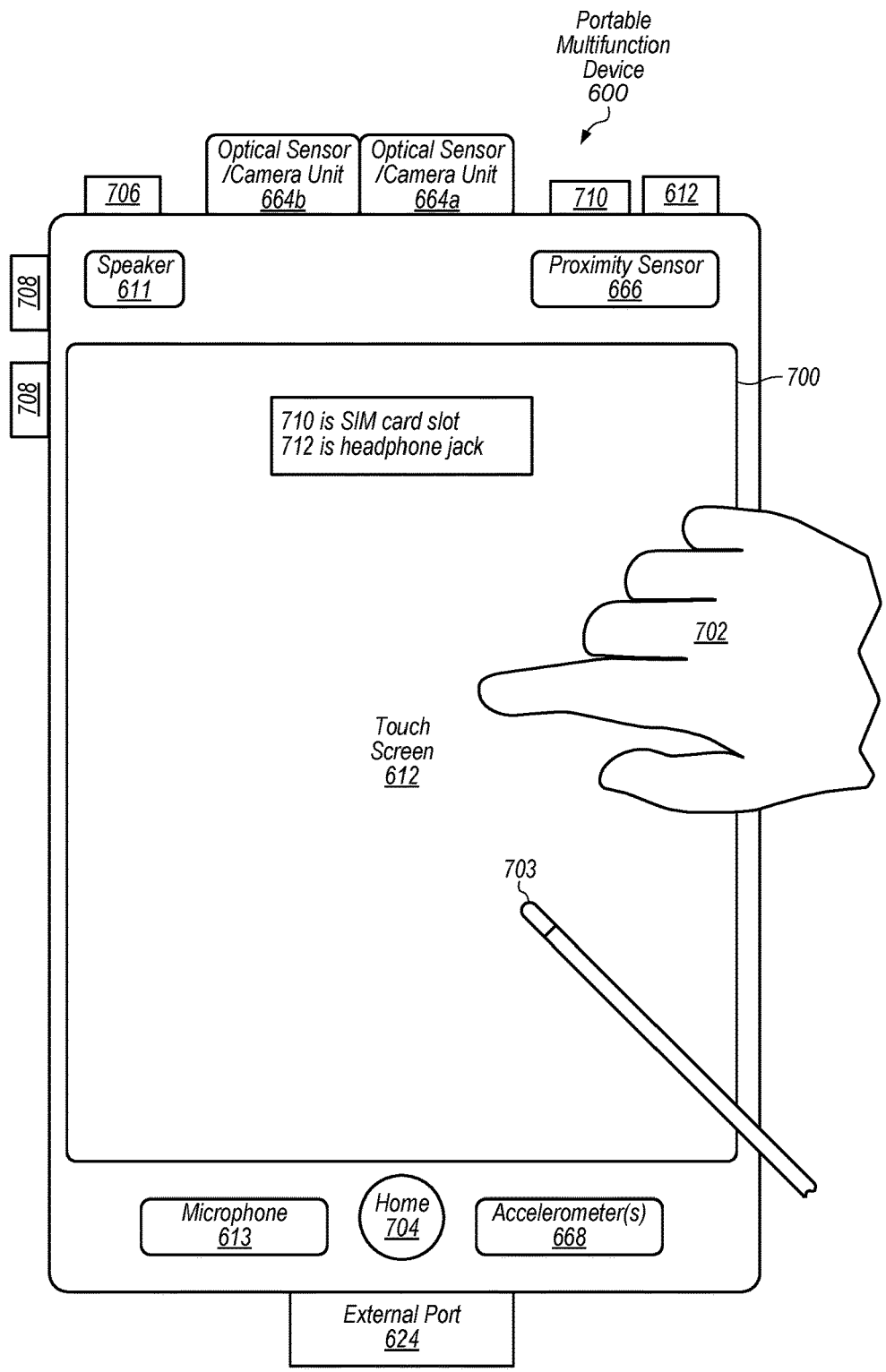
FIG. 7 depicts an example portable multifunction device that may include or host one or more camera modules, in accordance with some embodiments.

FIG. 7 illustrates a portable multifunction device 600 that may include or host embodiments of one or more of the camera modules disclosed herein, e.g., in the discussion above with reference to FIGS. 1-5. Device 600 may include a touch screen 612. The touch screen 612 may display one or more graphics within user interface (UI) 700. In this embodiment, as well as others described below, a user may select one or more of the graphics by making a gesture on the graphics, for example, with one or more fingers 702 (not drawn to scale in the figure) or one or more styluses 703 (not drawn to scale in the figure).

Device 600 may also include one or more physical buttons, such as "home" or menu button 704. As described previously, menu button 704 may be used to navigate to any application 636 in a set of applications that may be executed on device 600. Alternatively, in some embodiments, the menu button is implemented as a soft key in a GUI displayed on touch screen 612.

In one embodiment, device 600 includes touch screen 612, menu button 704, push button 706 for powering the device on/off and locking the device, volume adjustment button(s) 708, Subscriber Identity Module (SIM) card slot 710, head set jack 712, and docking/charging external port 624. Push button 706 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 600 also may accept verbal input for activation or deactivation of some functions through microphone 613.

It should be noted that, although many of the examples herein are given with reference to optical sensors/cameras 664a-b (on the front of a device), a rear-facing camera or optical sensor that is pointed opposite from the display may be used instead of or in addition to an optical sensors/cameras 664a-b on the front of a device.

Example Computer System

Figure 8:
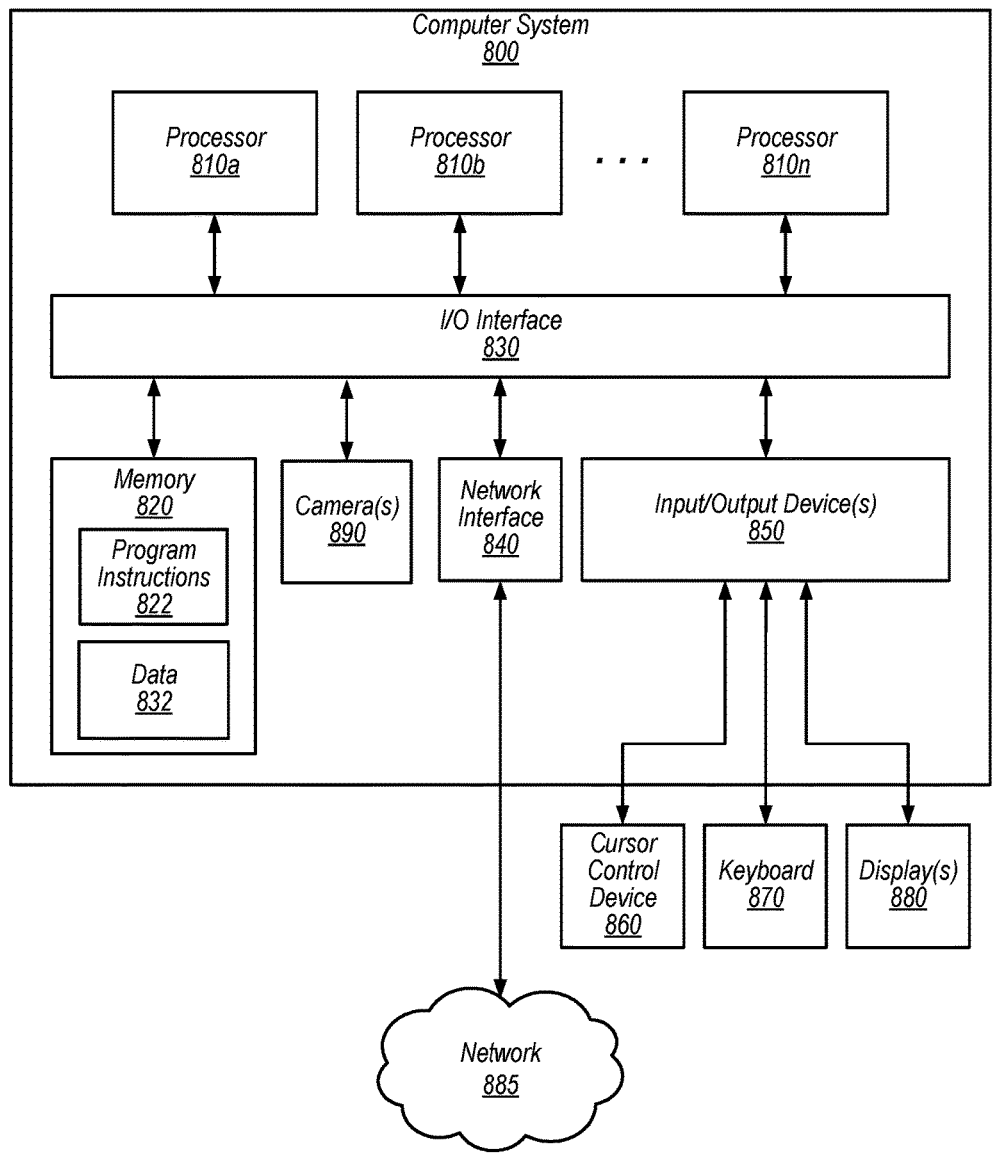
FIG. 8 illustrates an example computer system that may include or host one or more camera modules, in accordance with some embodiments.

FIG. 8 illustrates an example computing device, referred to as computer system 800, that may include or host embodiments of camera modules disclosed herein, e.g., in the discussion above with reference to FIGS. 1-5. In addition, computer system 800 may implement methods for controlling operations of the camera and/or for performing image processing of images captured with the camera. In different embodiments, computer system 800 may be any of various types of devices, including, but not limited to, a personal computer system, desktop computer, laptop, notebook, tablet or pad device, slate, or netbook computer, mainframe computer system, handheld computer, workstation, network computer, a camera, a set top box, a mobile device, a wireless phone, a smartphone, a consumer device, video game console, handheld video game device, application server, storage device, a television, a video recording device, a peripheral device such as a switch, modem, router, or in general any type of computing or electronic device.

In the illustrated embodiment, computer system 800 includes one or more processors 810 coupled to a system memory 820 via an input/output (I/O) interface 830. Computer system 800 further includes a network interface 840 coupled to I/O interface 830, and one or more input/output devices 850, such as cursor control device 860, keyboard 870, and display(s) 880. Computer system 800 may also include one or more cameras 890, for example one or more cameras that include one or more camera modules as described above with reference to FIGS. 1-5, which may also be coupled to I/O interface 830, or one or more cameras that include one or more camera modules as described above with reference to FIGS. 1-5 along with one or more other cameras such as wide-field and/or telephoto cameras.

In various embodiments, computer system 800 may be a uniprocessor system including one processor 810, or a multiprocessor system including several processors 810 (e.g., two, four, eight, or another suitable number). Processors 810 may be any suitable processor capable of executing instructions. For example, in various embodiments processors 810 may be general-purpose or embedded processors implementing any of a variety of instruction set architectures (ISAs), such as the x86, PowerPC, SPARC, or MIPS ISAs, or any other suitable ISA. In multiprocessor systems, each of processors 810 may commonly, but not necessarily, implement the same ISA.

System memory 820 may be configured to store program instructions 822 and/or data 832 accessible by processor 810. In various embodiments, system memory 820 may be implemented using any suitable memory technology, such as static random access memory (SRAM), synchronous dynamic RAM (SDRAM), nonvolatile/Flash-type memory, or any other type of memory. In the illustrated embodiment, program instructions 822 may be configured to implement various interfaces, methods and/or data for controlling operations of camera 890 and for capturing and processing images with integrated camera 890 or other methods or data, for example interfaces and methods for capturing, displaying, processing, and storing images captured with camera 890. In some embodiments, program instructions and/or data may be received, sent or stored upon different types of computer-accessible media or on similar media separate from system memory 820 or computer system 800.

In one embodiment, I/O interface 830 may be configured to coordinate I/O traffic between processor 810, system memory 820, and any peripheral devices in the device, including network interface 840 or other peripheral interfaces, such as input/output devices 850. In some embodiments, I/O interface 830 may perform any necessary protocol, timing or other data transformations to convert data signals from one component (e.g., system memory 820) into a format suitable for use by another component (e.g., processor 810). In some embodiments, I/O interface 830 may include support for devices attached through various types of peripheral buses, such as a variant of the Peripheral Component Interconnect (PCI) bus standard or the Universal Serial Bus (USB) standard, for example. In some embodiments, the function of I/O interface 830 may be split into two or more separate components, such as a north bridge and a south bridge, for example. Also, in some embodiments some or all of the functionality of I/O interface 830, such as an interface to system memory 820, may be incorporated directly into processor 810.

Network interface 840 may be configured to allow data to be exchanged between computer system 800 and other devices attached to a network 885 (e.g., carrier or agent devices) or between nodes of computer system 800. Network 885 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 840 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 850 may, in some embodiments, include one or more display terminals, keyboards, keypads, touchpads, scanning devices, voice or optical recognition devices, or any other devices suitable for entering or accessing data by computer system 800. Multiple input/output devices 850 may be present in computer system 800 or may be distributed on various nodes of computer system 800. In some embodiments, similar input/output devices may be separate from computer system 800 and may interact with one or more nodes of computer system 800 through a wired or wireless connection, such as over network interface 840.

As shown in FIG. 8, memory 820 may include program instructions 822, which may be processor-executable to implement any element or action to support integrated camera 890, including but not limited to image processing software and interface software for controlling camera 890. In some embodiments, images captured by camera 890 may be stored to memory 820. In addition, metadata for images captured by camera 890 may be stored to memory 820.

Those skilled in the art will appreciate that computer system 800 is merely illustrative and is not intended to limit the scope of embodiments. In particular, the computer system and devices may include any combination of hardware or software that can perform the indicated functions, including computers, network devices, Internet appliances, PDAs, wireless phones, pagers, video or still cameras, etc. Computer system 800 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system 800 via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 800 may be transmitted to computer system 800 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A camera module, comprising:
  a lens holder configured to hold one or more lens elements of a camera; and
  an image sensor configured to capture light projected onto a first side of the image sensor, the image sensor disposed at least partially within the lens holder and fixed to the lens holder such that the image sensor is oriented in an optically aligned position relative to at least one of the one or more lens elements.

2. The camera module of claim 1, wherein the image sensor includes:
a second side that is opposite the first side of the image sensor; and
one or more electrical connections disposed at least partially between the first side of the image sensor and the second side of the image sensor, the one or more electrical connections being configured to transmit image signals from the first side of the image sensor to the second side of the image sensor.

3. The camera module of claim 2, further comprising a flex circuit board that is bonded to the image sensor, the flex circuit board configured to receive the image signals from the second side of the image sensor.

4. The camera module of claim 3, wherein:
the image sensor includes one or more image sensor contact elements on the second surface that is opposite the first surface;
the flex circuit board includes one or more flex contact elements; and
the flex circuit board is bonded to the image sensor such that at least one of the one or more flex contact elements is in electrical communication with at least one of the one or more image sensor contact elements.

5. The camera module of claim 1, wherein the lens holder further includes:
a barrel portion defining a first recess, the barrel portion being configured to hold the one or more lens elements within the first recess; and
a base portion defining a second recess, the base portion extending from the barrel portion;
wherein the image sensor is disposed within the second recess and bonded to the base portion.

6. The camera module of claim 5, wherein:
the barrel portion of the lens holder further defines an aperture configured to allow light to pass through the lens holder and to the one or more lens elements.

7. The camera module of claim 1, further comprising:
an adhesive disposed between at least a portion of the image sensor and at least a portion of the lens holder, wherein the adhesive is configured to fix the image sensor to the lens holder.

8. A mobile device, comprising:
a lens holder configured to hold one or more lens elements of a camera; and
a photosensor fixed to the lens holder, the photosensor including:
a first side for capturing light projected onto the first side; and
a second side that is opposite the first side;
wherein the photosensor is configured to transmit image signals from the first side to the second side; and
a flex circuit board that is bonded to the photosensor, the flex circuit board configured to receive the image signals from the second side of the photosensor.

9. The mobile device of claim 8, wherein:
the second side of the photosensor includes one or more contact elements configured to contact the flex circuit board and transmit the image signals from the second side of the photosensor to the flex circuit board.

10. The mobile device of claim 8, wherein the photosensor further includes:
at least one vertical interconnect access (VIA) within the photosensor for transmitting the image signals from the first side of the photosensor to the second side of the photosensor.

11. The mobile device of claim 8, wherein the photosensor is oriented such that it is optically aligned with an optical axis of the one or more lens elements.

12. The mobile device of claim 8, further comprising at least one of:
an optical filter disposed between the one or more lens elements and the photosensor; or
an optical filter coating applied to at least one of the one or more lens elements.

13. The mobile device of claim 8, further comprising:
a stiffener substrate disposed proximate the flex circuit board, the stiffener substrate being bonded to at least one of the lens holder or the flex circuit board;
wherein the flex circuit board is disposed between the photosensor and the stiffener substrate.

14. The mobile device of claim 8, wherein:
the photosensor is disposed such that a back focal length (BFL) between the one or more lens elements and the photosensor is between about 100 micrometers and about 200 micrometers.

15. The mobile device of claim 8, wherein the lens holder includes:
a first portion defining a first recess that extends from a first surface of the lens holder to a second surface of the lens holder, the first portion configured to hold the one or more lens elements within the first recess; and
a second portion defining a second recess that extends from the second surface of the lens holder to a third surface of the lens holder;
wherein the photosensor is disposed within the second recess and bonded to the second portion proximate the second surface.

16. The mobile device of claim 15, wherein:
the first portion of the lens holder defines an aperture configured to allow light to pass through the lens holder and to the one or more lens elements;
the first surface defines a first plane;
the second surface defines a second plane that is parallel to the first plane;
the third surface defines a third plane that is parallel to the first plane and to the second plane; and
the one or more lens elements define an optical axis that intersects the first plane, the second plane, and the third plane.

17. The mobile device of claim 15, wherein:
a height of the lens holder is defined by a distance from the first surface of the lens holder to the third surface of the lens holder; and
the height of the lens holder is between about 1.4 millimeters and about 3.9 millimeters.

18. A method of manufacturing a camera module, comprising:
receiving a lens holder that defines a first recess and a second recess, wherein the lens holder holds one or more lens elements within the first recess; and
applying an adhesive to at least one of a photosensor or the lens holder;
placing the photosensor within the second recess of the lens holder such that the adhesive is in contact with at least a portion of the photosensor and at least a portion of the lens holder;
performing active alignment to orient the photosensor to an aligned position relative to the one or more lens elements, wherein the photosensor is optically aligned with the one or more lens elements when the photosensor is oriented in the aligned position; and curing the adhesive to bond the photosensor to the lens holder and to fix the photosensor in the aligned position.

19. The method of claim 18, wherein the performing active alignment includes:

monitoring at least one optical parameter that is based at least in part upon the photosensor receiving light that has passed through the one or more lens elements; and iteratively adjusting positioning of the photosensor relative to the one or more lens elements until the at least one optical parameter satisfies at least one optical threshold.

20. The method of claim 18, further comprising:

bonding a flex circuit board to the photosensor such that at least one contact element of the flex circuit board is in contact with at least one contact element of the photosensor.

* * * * *